(12) United States Patent
Liu

(10) Patent No.: US 11,126,159 B2
(45) Date of Patent: Sep. 21, 2021

(54) MULTI-OBJECTIVE CALIBRATIONS OF LITHOGRAPHY MODELS

(71) Applicant: Mentor Graphics Corporation, Wilsonville, OR (US)

(72) Inventor: Huikan Liu, Fremont, CA (US)

(73) Assignee: Siemens Industry Software Inc., Plano, TX (US)

( * ) Notice: Subject to any disclaimer, the term of this patent is extended or adjusted under 35 U.S.C. 154(b) by 113 days.

(21) Appl. No.: 16/738,571

(22) Filed: Jan. 9, 2020

(65) Prior Publication Data
US 2021/0216059 A1 Jul. 15, 2021

(51) Int. Cl.
G05B 99/00 (2006.01)
G05B 19/4097 (2006.01)
G03F 7/20 (2006.01)

(52) U.S. Cl.
CPC ......... *G05B 19/4097* (2013.01); *G03F 7/705* (2013.01); *G05B 2219/32035* (2013.01); *G05B 2219/35012* (2013.01); *G05B 2219/45028* (2013.01); *G05B 2219/45031* (2013.01)

(58) Field of Classification Search
CPC .......................................... G05B 2219/32035
USPC .......................................................... 700/98
See application file for complete search history.

(56) References Cited

U.S. PATENT DOCUMENTS

| | | | | |
|---|---|---|---|---|
| 9,047,532 | B2* | 6/2015 | Menadeva | G06T 7/0006 |
| 9,588,439 | B1* | 3/2017 | Bruguier | G06F 30/20 |
| 9,857,693 | B1 | 1/2018 | Liu et al. | |
| 2002/0078429 | A1* | 6/2002 | Yoshida | G03F 7/70725 |
| | | | | 716/55 |
| 2003/0229881 | A1* | 12/2003 | White | G06F 30/39 |
| | | | | 716/52 |
| 2005/0132306 | A1* | 6/2005 | Smith | G06F 30/39 |
| | | | | 716/114 |
| 2005/0188338 | A1* | 8/2005 | Kroyan | G06F 30/39 |
| | | | | 716/124 |

(Continued)

OTHER PUBLICATIONS

Chris Mack, Improved Methods for Lithography Model Calibration, 2007, Photomask and Next-Generation Lithography Mask Technology XIV, pp. 9 (Year: 2007).*

(Continued)

*Primary Examiner* — Suresh Suryawanshi

(57) ABSTRACT

A system may include a model calibration engine configured to determine a candidate lithography model set from which to calibrate a lithography model according to multiple objectives, including by initializing a population of parent candidate models, generating child candidate models, merging the parent and child candidate models into a merged population, classifying the candidate models of the merged population into tiers of non-dominated fronts according to respective objective functions for the multiple objectives, determining a subset of the merged population based on the classified tiers, and identifying, as the candidate lithography model set, a Pareto-optimal front of the subset of the merged population determined based on the classified tiers. The system may also include a model selection engine configured to set a given candidate lithography model in the candidate lithography model set as a calibrated lithography model for simulating a lithographic process.

20 Claims, 5 Drawing Sheets

(56) References Cited

U.S. PATENT DOCUMENTS

| | | | | |
|---|---|---|---|---|
| 2011/0222739 | A1* | 9/2011 | Zhou | G03F 7/705 |
| | | | | 382/112 |
| 2013/0332894 | A1* | 12/2013 | Ye | G03F 7/004 |
| | | | | 716/56 |
| 2018/0365370 | A1* | 12/2018 | Egan | G06F 3/04815 |
| 2020/0278604 | A1* | 9/2020 | Lo | G03F 1/36 |

OTHER PUBLICATIONS

Cheng-En Wu, David Wei, Charlie Zhang, and Hua Song, "Low-contrast photoresist development model for OPC application at 10nm node", Proc. SPIE 9426, Optical Microlithography XXVIII, Mar. 18, 2015, pp. 94260N1-94260N10.

\* cited by examiner

MULTI-OBJECTIVE CALIBRATIONS OF LITHOGRAPHY MODELS

BACKGROUND

Electronic circuits, such as integrated circuits, are used in nearly every facet of modern society from automobiles to microwaves to personal computers. Design of circuits may involve many steps, known as a "design flow." The particular steps of a design flow are often dependent upon the type of microcircuit being designed, its complexity, the design team, and the circuit fabricator or foundry that will manufacture the circuit. Electronic design automation (EDA) applications support the design and verification of circuits prior to fabrication. EDA applications may implement various EDA procedures, e.g., functions, tools, or features to analyze, test, or verify a circuit design at various stages of the design flow.

BRIEF DESCRIPTION OF THE DRAWINGS

Certain examples are described in the following detailed description and in reference to the drawings.

DETAILED DESCRIPTION

Figure 1:
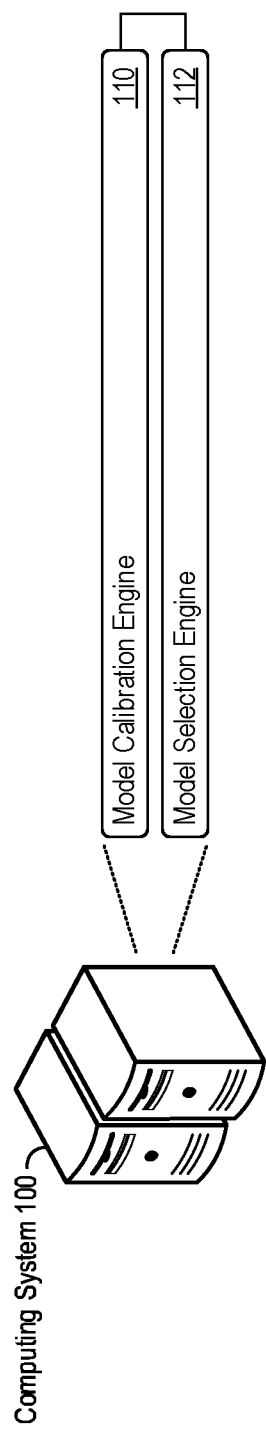
FIG. 1 shows an example of a computing system that supports multi-objective calibrations of lithography models.

Integrated circuits are used in nearly every context of modern society. Modern fabrication processes for circuit manufacture may use lithography, which may include recording a binary image (e.g., a pattern) on a layer of photosensitive material (such as a photoresist) spun over a substrate (e.g., semiconductor wafer). Circuit manufacture may include a series of steps to deposit layers of different materials on a substrate, expose specific portions of each layer to radiation (e.g., light), and then etch the exposed (or non-exposed) portions of the layer away. As an illustrative example, a semiconductor device component may be manufactured by the following steps. First, a positive type epitaxial layer is grown on a silicon substrate through chemical vapor deposition. Next, a nitride layer is deposited over the epitaxial layer. Then, specific areas of the nitride layer are exposed to radiation, and the exposed areas are etched away, leaving behind exposed areas on the epitaxial layer (areas no longer covered by the nitride layer). The exposed areas can then be subjected to a diffusion or ion implantation process, causing dopants (such as phosphorus) to enter the exposed epitaxial layer and form charged wells. Such a process of depositing layers of material on the substrate or subsequent material layers, and then exposing specific patterns to radiation, etching, and dopants or other diffusion materials, can then be repeated a number of times, allowing the different physical layers of the circuit to be manufactured.

To expose selected portions of a physical material layer to radiation, a lithographic mask can be created and used to direct the radiation exposure. Lithographic masks may be created from circuit layout data. To illustrate, the geometric elements described in a design layout may define the relative locations or areas of the circuit that will be exposed to radiation through the lithographic mask. A reticle writing tool can be used to create the mask based upon a circuit design layout, after which the mask can be used in a photolithographic process to limit radiation exposure specifically to the circuit portions specified in the circuit design layout.

As circuit designs continue to increase in complexity and circuit components decrease in size, the shapes reproduced on a substrate (and thus the corresponding shapes in a lithographic mask) may likewise decrease in size and spacing. Reductions in circuit feature sizes may increase the difficulty of faithfully and accurately reproducing the circuit shape, design, and image intended by the design layout onto the physical substrate. This may be the case as diffractive effects of light often result in defects in which an intended image is not accurately "printed" onto the substrate during the photolithographic process, thus resulting in flaws in manufactured circuit components. Resolution enhancement techniques (RETs), including optical proximity correction (OPC), can be used to improve the resolution of an image that the mask forms on the physical substrate during the photolithographic process.

In OPC processes, edges of the geometric elements in a circuit design can be fragmented. The size of the edge fragments in a given circuit design may depend upon the OPC process parameters, often referred to as the OPC "recipe." While not all edges within a layout design are fragmented in every OPC process, these edges may also be referred to as edge fragments. The degree of fragmentation and placement of edge fragments may be determined by modeling photolithographic processes. In model-based OPC processes, the printed image may be simulated. That is, a photolithographic process to manufacture circuit components can be simulated via lithography models in order to produce a simulated printed image. This simulated image can be compared to a target image, and the distances between the target image and the simulated image can be referred to as the edge placement error (EPE). Accordingly, in many model-based OPC processes, edge fragments or unfragmented edges have an associated edge placement error (also referred to as an associated edge placement error value).

In the OPC process, edge fragments in a circuit layer can be individually moved or adjusted in order to enable the simulated image for a lithographic mask to reproduce the target image as accurately as possible. Such a flow of moving the edge fragments, simulating the image via lithography models using the moved edge fragments, and comparing the simulated image to the target image may be repeated multiple times. Each cycle of such a flow may be referred to as an iteration of the OPC process.

The effectiveness of an OPC process may depend on the accuracy and predictability of lithography models used to simulate a lithography process for circuit manufacture. Lithography models may refer to or include any mathematical or empirical representation of a lithographic process. As such, lithography models may mathematically represent the distinct steps in a patterning sequence to print or manufacture circuits through lithographic processes via use of lithographic masks. These lithography models (sometimes also referred to as OPC models or lithographic process models) may include optical models for aerial image formation as well as resist or etch models to represent photoresist-associated steps such as exposure, post-exposure bake, development, and pattern transfer. Optical lithography models for full-chip simulation are usually quasi-rigorous. For example, the Hopkins optical model may be approximated by a sum of coherent systems approximation method. On the other hand, resist or etch models can be empirical in nature, at least in part. As such, a resist model may be implemented via a mathematical formulation to provide a transfer function between inputs and measured outputs of interest. Due to such an empirical nature, resist/etch models may require calibration based on physical measurements on printed wafers. Such physical measurements may be referred to as gauges. Calibration of such lithography models may involve the training or setting of lithography model parameters to fit simulation data generated by the lithography models with physical measurement data.

The degree of accuracy to which model calibrations fit generated simulation data to physical measurement data may be assessed through accuracy objectives, which may refer to any quantitative metric specified to measure fit between simulation data generated by a lithography model and physical measurement data. Furthermore, accuracy objectives may be applied to a subset of physical measurement (gauge) data in addition to the overall fitting to the physical measurement data as a whole. Additionally or alternatively, lithography models may be evaluated based upon robustness objectives, which may refer to any quantitative metric that evaluates how sensitive a lithography model is in response to simulation settings, optical signals, and the like. A lithography model with high accuracy but low robustness may cause catastrophic failures to OPC, and therefore may not be applied in practice. Robustness objectives need not be associated, correlated, evaluated, or determined based on physical measurement data (e.g., gauges).

Examples of accuracy objectives for lithography calibration include a maximum error between lithography model outputs and physical measurement data, root mean square (RMS) of critical dimensions (CDs), error value ranges (e.g., difference between minimal and maximal error values), model consistency or stability metrics, and more. Examples of robustness objectives include simulation consistency, which may assess how sensitive a given lithography model is relative to model simulation conditions, or stability, which may evaluate the difference between a lithography model and its optical input signals.

Each objective (whether for accuracy or robustness) may be quantified through an objective function, and thus may be used to quantitatively assess accuracy of lithography model calibrations. Objectives for lithography calibration, regardless of which metric (overall or partial accuracy, accuracy or robustness, RMS or CD range or maximal error values), are generally conflicting, thereby preventing simultaneous optimization of each objective separately. Lithography models and calibrations with a single objective are described in U.S. Pat. No. 9,857,693, issued on Jan. 2, 2018 and titled "LITHOGRAPHY MODEL CALIBRATION VIA CACHE-BASED NICHING GENETIC ALGORITHMS", which is referred to herein as "the '693 patent" and incorporated by reference herein its entirety.

Current techniques may limit lithography calibrations to a single objective, e.g., calibrate a lithography model with model parameter values to minimize an RMS-based objective or a maximal CD error objective, but not both. While such single-objective calibrations may provide lithography models that excel in meeting a particular simulation goal, in practice, many circuit designers may desire to evaluate lithography models across multiple different objectives to assess potential modeling trade-offs (e.g., between RMS and maximal CD error objectives, between accuracy of 1D patterns and 2D patterns, between error-based accuracy and model consistency, etc.). Manual consideration of multiple objectives can be cumbersome and inaccurate, often involving calibrating a lithography model repeatedly to a particular objective by using different tweaks, such as adjusting gauge weights, random splitting of the gauge set, perturbing the search settings, etc., and manually determining impact on a secondary objective.

The features described herein may support multi-objective calibration of lithography models. As described in greater detail herein, the multi-objective calibration features of the present disclosure may support tuning lithography models according to multiple different objectives, which may allow the generation of "trade-off" models tuned with model parameter values that balance the different objectives or the construction of models subject to non-linear constraints, e.g., minimizing a first objective subject to a configured, specified, or desired threshold for a second objective. To support such features, the multi-objective calibrations described herein may apply genetic algorithms specifically tailored to determine a set of candidate lithography models (from which to calibrate a lithography model) with increased population diversity and increased uniformity of distribution. Such an output population of candidate lithography models may be presented to correlate (and thus evaluate) the multiple objectives, and may do so at a comparable run-time to current single-objective lithography calibration techniques. Thus, the features described herein may provide a greater flexibility and capability in lithography modeling, and do so in an efficient manner as compared to existing single-objective calibration techniques.

These and other multi-objective calibration features and technical benefits are described in greater detail herein.

FIG. 1 shows an example of a computing system 100 that supports multi-objective calibrations of lithography models. The computing system 100 may include a single or multiple computing devices such as application servers, compute nodes, data servers, desktop or laptop computers, cloud computing resources, smart phones or other mobile devices, tablet devices, embedded controllers, and more. In some implementations, the computing system 100 may implement an EDA system that supports multi-objective calibration of lithography models according to the present disclosure.

To implement any of the various features described herein, the computing system 100 may include a model calibration engine 110 and a model selection engine 112. The computing system 100 may implement the model calibration engine 110 and model selection engine 112 (and components thereof) in various ways, for example as hardware and programming implemented via local resources of the computing system 100. The programming for the engines 108 and 110 may take the form of processor-executable instructions stored on a non-transitory machine-readable storage medium and the hardware for the engines 108 and 110 may include a processor to execute those instructions. A processor may take the form of single processor or multi-processor systems, and in some examples, the computing system 100 implements multiple engine components or system elements using the same computing system features or hardware components (e.g., a common processor or common storage medium for the model calibration engine 110 and the model selection engine 112).

In operation, the model calibration engine 110 may determine a candidate lithography model set from which to calibrate a lithography model according to multiple objectives. The lithography model may be configured to simulate a lithographic process for manufacturing an integrated circuit, and each of the multiple objectives may be evaluated for the lithography model through a respective objective function. Genetic algorithms are a heuristic approach to multi-objective optimization problems, and may be applied by the model calibration engine 110 for multi-objective calibrations as discussed herein. Determination of the candidate lithography model set by the model calibration engine 110 may include initializing a population of parent candidate models, the parent candidate models derived based on the lithography model and each given parent candidate model having a respective model parameter value set for the lithography model, generating child candidate models from the parent candidate models, merging the parent candidate models and the child candidate models into a merged population of candidate models, classifying the candidate models of the merged population into tiers of non-dominated fronts according to the respective objective functions for the multiple objectives, determining a subset of the merged population based on the classified tiers of non-dominated fronts, and identifying, as the candidate lithography model set, a Pareto-optimal front of the subset of the merged population determined based on the classified tiers. In operation, the model selection engine 112 may set a given candidate lithography model in the candidate lithography model set as a calibrated lithography model for simulating the lithographic process.

These and other example multi-objective calibration features according to the present disclosure are described in greater detail next.

Figure 2:
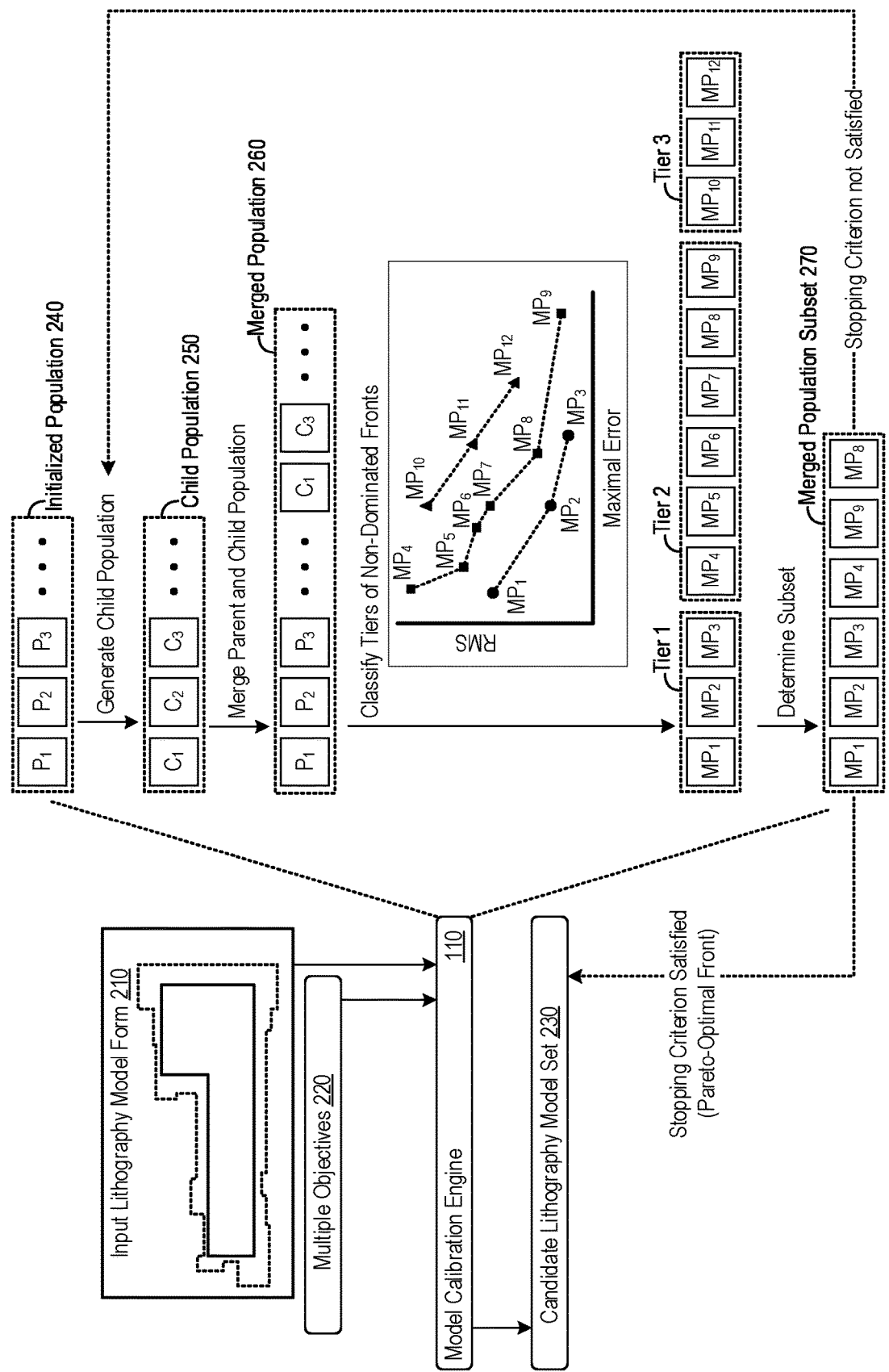
FIG. 2 shows an example of a lithography model calibration according to multiple objectives to determine a candidate lithography model set.

FIG. 2 shows an example of a lithography model calibration according to multiple objectives to determine a candidate lithography model set. In the example shown in FIG. 2, performing of the lithography model calibration is described with respect to the model calibration engine 110, though various other implementations are possible.

To support multi-objective calibration of lithography models, the model calibration engine 110 may access an input lithography model form to calibrate as well as multiple objectives for which to calibrate the input lithography model. The input lithography model form may, in effect, represent an uncalibrated lithography model and include one or multiple optional seed models to calibrate and calibration settings (e.g., model parameters to calibrate, search ranges of model parameters, etc.). Thus, the model calibration engine 110 may calibrate a lithography model initially represented as or provided as an input through an input lithography model form. In the example shown in FIG. 2, the model calibration engine 110 accesses the input lithography model form 210 (which may include an input lithography model form, seed models, and calibration settings) and the multiple objectives 220, which may be identified through user input. The input lithography model form 210 may be implemented semi-empirically or arbitrarily, and a general model form may require calibration of model parameter values in order to fit model outputs to physical measurement data (e.g., input gauges), doing so for the particular resist, etching, or other lithography process that the input lithography model form 210 is configured to simulate. As such, the input lithography model form 210 may provide a mathematical representation of the simulated process (e.g., resist forming or etching process), but without being tuned to a specific model parameter values in the mathematical set in order to fit model outputs to the physical measurement data that the input lithography model form 210 is being calibrated to. The model calibration engine 110 may also access a calibration dataset with input gauge sets or other physical measurement data through which the model calibration engine 110 may evaluate candidate models according to the multiple objectives 220.

The output of a model calibration process by the model calibration engine 110 may be a set of candidate lithography models, such as the candidate lithography model set 230 shown in FIG. 2. The candidate lithography model set 230 may include a distribution of different candidate lithography models to set (e.g., use) as a calibrated lithography model for the input lithography model form 210. In particular, each candidate lithography model in the candidate lithography model set 230 may have a different set of model parameter values, and may provide varying degrees of "accuracy" and/or "robustness" as measured with respect to the multiple objectives 220 for which the input lithography model form 210 is calibrated according to. In that regard, the candidate lithography model set 230 may provide a representation (e.g., a spectrum) of various trade-offs determined by the model calibration engine 110 that can be achieved through the determined set of candidate lithography models output from a model calibration.

The multiple objectives 220 accessed by the model calibration engine 110 may include two or more objectives that the model calibration engine 110 may account for in calibrating the input lithography model form 210 to physical measurement data or other model-related data that reflects certain properties of lithography models. In some implementations, the multiple objectives include a primary objective and one or more secondary objectives. OPC model calibrations, in some examples, may comprise different loops to determine various model parameter values of an OPC model. For instance, resist and etch model calibrations may include an internal loop to determine linear coefficients of the lithography model as well as an external loop to non-linear parameters. In such examples, the model calibration may apply a primary objective (but not the secondary objective(s)) to the interior loops for the determination of linear coefficients and apply the multiple objectives 220 (including both the primary objective and secondary objective(s)) for calibration of the non-linear parameters via the exterior loop.

The multiple objectives 220 may include any type of quantitative metric by which the model calibration engine 110 may evaluate lithography model outputs to physical measurement data or model robustness relative to simulation settings and/or optical signals. Each objective may be associated with (or implemented via) a corresponding objective function, through which the model calibration engine 110 may quantitatively evaluate a degree of accuracy or robustness that candidate lithography models (populated with specific parameter model values) achieve with respect to each of the multiple objectives 220. Explained in another way, each of the multiple objectives 220 may be evaluated by the model calibration engine 110 through a corresponding objective function.

Example objectives for which the model calibration engine 110 may calibrate the input lithography model form 210 include RMS objectives evaluated through an RMS-based objective function (e.g., RMS of a CD of model outputs), maximal CD error objectives evaluated through maximal CD error-based objective functions, consistency objectives evaluated through consistency-based objective functions (e.g., measured through a delta between lithography model outputs for minor variations in resist or etching conditions), stability objectives evaluated through consistency-based objective functions (e.g., measured through the difference between lithography model outputs and input optical signals), error range objectives evaluated through a determined range value between maximal and minimal error values, etc. In some implementations, the multiple objectives 220 accessed by the model calibration engine 110 may include a primary objective evaluated through a root mean square-based objective function and a secondary objective evaluated through a maximal critical dimension error-based objective function. Various other objective configurations are contemplated herein.

As yet another example, the multiple objectives 220 may include different objectives with the same underlying objective function, but applied to different portions of model outputs and physical measurement data. For instance, the multiple objectives 220 may include a primary objective evaluated for a full set of gauges of physical measurement data used to evaluate a lithography model (e.g., all 2,000 input gauges for a particular lithography process) as well as a secondary objective evaluated for a selected subset of the gauges (e.g., 100 selected gauges out of the full 2,000 gauge input set). In such cases, the underlying objective function may be the same (e.g., maximal error), but the secondary objective of the multiple objectives 220 may be specific only to a select portion of the simulation output-to-physical measurement data comparison whereas the primary objective is evaluated with the entire calibration dataset. For such a form of multi-objective calibration, the model calibration engine 110 may provide up to a complete spectrum of various trade-offs that prioritizes the selected portion of the input gauge set in different degrees, for which to generate candidate lithography models for the model calibration, thus allowing a trade-off of a calibrated lithography model with outputs that better fit to a selected portion of the input gauges (e.g., at a cost of an overall fit with lesser accuracy).

To calibrate the input lithography model form 210 to an input gauge set according to the multiple objectives 220, the model calibration engine 110 may apply any number of multi-objective optimization techniques. To illustrate, the model calibration engine 110 may represent the model calibration for the input lithography model form 210 as a multi-objective optimization problem to minimize (or maximize)=$\vec{y} \times (f_1(\vec{x}), f_2(\vec{x}), \ldots, f_m(\vec{x}))$, in which $\vec{x}$ is a decision vector such that $\vec{x}=(x_1, x_2, \ldots, x_n) \in X$ and $\vec{y}$ is an objective vector such that $\vec{y}=(y_1, y_2, \ldots, y_m)$–Y. Expressed in terms of model calibration terminology, each decision vector $\vec{x}$ may represent a set of model parameter values for the input lithography model form 210 (or expressed in another way, a candidate lithography model to calibrate the input lithography model 210 form to). Each function $f$ may represent a different objective function for the m number of multiple objectives 220 to calibrate the input lithography model 210 according to. The objective vector may represent an evaluation of a particular decision vector $\vec{x}$ (e.g., a particular candidate lithography model).

To process such a multi-objective optimization problem, the model calibration engine 110 may apply genetic algorithms to generate, evolve, and evaluate populations of candidate lithography models to potentially set as a calibrated lithography model for the input lithography model form 210. Genetic algorithms are described also in the '693 patent, and the model calibration engine 110 may apply any of the genetic algorithm techniques described therein. Additionally or alternatively, the model calibration engine 110 may tailor any applied genetic algorithms specifically to account for the multiple objectives 220 for which to calibrate the input lithography model form 210. Various example features of tuned genetic algorithms that the model calibration engine 110 may apply according to the present disclosure are depicted in FIG. 2, described next.

In a model calibration through genetic algorithms, the model calibration engine 110 may initialize a population of candidate models, such as an initialized population 240 shown in FIG. 2. Each candidate model may be characterized through (e.g., represented as or identified as) a set of model parameter values for the input lithography model form 210, e.g., in vector form consistent with a decision vector $\vec{x}$ for multi-optimization problems. In some examples, the model calibration engine 110 initializes the model parameters values of the initialized population 240 in a random manner. The number of candidate models initialized by the model calibration engine 110 (e.g., as an initial population) may be configurable according to specific calibration parameters (e.g., an initial population of five hundred (500) candidate models). In some implementations, the model calibration engine 110 may evaluate each candidate model in the initialized population 240 according to the multiple objectives 220, e.g., by computing an objective vector for each candidate model according to each objective function $f$ respectively for the multiple objectives 220.

Next, the model calibration engine 110 may generate a child population 250. For an initial iteration of the genetic algorithm, the model calibration engine 110 may generate a child population 250 from the initialized population 240, with the child population 250 comprised of child candidate models. In some implementations, the model calibration engine 110 generates the child population 250 from a parent population using a binary tournament selection scheme, crossovers, mutations, or any combination thereof. Binary tournament selection may be particularly useful to support vector comparisons, as tournament selections may be applied to vectors of non-dominated front tier values and crowding distance values, features as discussed in greater detail herein. Crossovers applied by the model calibration engine 110 may be restricted crossovers, e.g., as described in the '693 patent. In some implementations, the model calibration engine 110 may prohibit crossovers with resist parameters (also referred to as resist terms) of the candidate models, as doing so may improve performance and calibration latency with a reduced impact on calibration effectiveness. Additionally or alternatively, the model calibration engine 110 may use resist term caching and model caching to reduce calibration run times.

With regards to mutations, the model calibration engine 110 may apply Gaussian mutations with a relatively low, but non-zero, default mutation probability (e.g., 0.002). By specifically using Gaussian mutations at such a low mutation probability, the described model calibrations may increase the diversity of output candidate lithography model sets while maintaining a stable evolution between population generations. In some implementations, the model calibration engine 110 may also evaluate each candidate model in the child population 250 according to the multiple objectives 220, e.g., in a consistent manner as with the initialized population 240 or as otherwise described herein. Evaluation of the initialized population 240, child population 250, or subsequent generations of populations may include determination of Pareto-optimal fronts as described herein.

In a given iteration of a genetic algorithm, the model calibration engine 110 merges a child population 250 with the parent population from which the child population 250 is generated. In an initial iteration, the model calibration engine 110 may merge the child population 250 with the initialized population 240. In subsequent iterations, the model calibration engine 110 may merge a child population 250 with a parent population from which the child population 250 is generated. To merge parent and child populations, the model calibration engine 110 need not include every candidate model in each of the populations. For example, the child population 250 and a parent population may include one or more identical/redundant candidate models (e.g., candidate models with an identical set of model parameter values).

In such cases, including completely identical candidate models in a merged population may decrease the diversity of subsequent generations and limit the exploration of the population space (also referred to as search face). Limited population diversity may reduce the ability of the model calibration engine 110 to determine increasingly optimized model parameter values to calibrate the input lithography model form 210 (e.g., converge closer to a true Pareto-optimal front for the multi-optimization problem). As such, in merging parent and child populations of candidate models, the model calibration engine 110 may exclude, from a merged population, any overlapping or redundant candidate models included in both a parent population and a child population. In some implementations, the model calibration engine 110 excludes only a selected subset of the overlapping candidate models in both the parent and child populations, e.g., Pareto-optimal models that are present in both the parent and child populations will not be included twice in the merged population. To illustrate further, responsive to a determine that a Pareto-optimal candidate model of the child population is already included in the parent population, the model calibration engine 110 may determine to add only a single instance of such a candidate model to a merged population instead of including both instances as found in the parent population and the child population.

As described herein, the model calibration engine 110 may merge the child population 250 with a parent population (e.g., the initialized population 240) to form a merged population 260 of candidate models.

As another feature of the multi-objective calibration process, the model calibration engine 110 may classify the merged population 260 into tiers of non-dominated fronts. Classification of non-dominant fronts by the model calibration engine 110 may be performed based on the particular multi-objective optimization for which the model calibration engine 110 calibrates an input lithography model form 210. For minimization problems, the model calibration engine 110 may determine tiers of non-dominated candidate models based on computed objective vectors $\vec{y}$ for each candidate model. In a general sense for a minimization problem including two candidate models $\vec{a}$ and $\vec{b}$, the model calibration engine 110 may determine that $\vec{a}$ dominates $\vec{b}$ (or expressed as $\vec{a} \succ \vec{b}$) responsive to a determination that $f_i(\vec{a}) < f_i(\vec{b})$, $\forall i \in \{1,2, \ldots, m\} \wedge f_j(\vec{a}) < f_j(\vec{b})$, $\exists j \in \{1,2, \ldots, m\}$. The model calibration engine 110 may characterize a decision vector (representative of a particular candidate model) that is not dominated by any other vectors in a merged population 260 as Pareto-optimal. Moreover, the model calibration engine 110 may identify the set of Pareto-optimal decision vectors in a merged population 260 as a Pareto-optimal set or Pareto-optimal front. Such a Pareto-optimal front of the merged population 260 may correspond to a set of candidate models for calibrating the input lithography model 250, and the model calibration engine 110 may classify the Pareto-optimal front of the merged population as a first tier of non-dominated fronts in the merged population 260.

Subsequent tiers of non-dominated fronts in the merged population 260 may be classified via a "remove-and-identify" process by the model calibration engine 110. Such a process may include determination of a subsequent tier of non-dominated fronts via removal of the previously tier from the search space and identification of the new Pareto-optimal front of the updated search space. To illustrate, for a merged population 260, the model calibration engine 110 may identify a second tier of non-dominated fronts by removing a first tier of non-dominated fronts (e.g., the Pareto-optimal front of the entire merged population 260) and then identifying the Pareto-optimal front of the updated merged population. Then, the model calibration engine 110 can classify a third tier of non-dominated fronts by removing the candidate models in the first and second tiers of non-dominated fronts from the merged population 260, and then determining the Pareto-optimal front of the updated merged population. Fourth, fifth, and subsequent tiers may be similarly classified.

As an illustrative example shown in FIG. 2, a merged population 260 may include at least twelve different candidate models identified as $MP_1$, $MP_2$, $MP_3$, ... $MP_{12}$. An example mapping of the different candidate models $MP_1$-$MP_{12}$ is shown in FIG. 2 with respect to RMS and maximal error-based objectives for a multi-objective minimization problem. In such an example, the model calibration engine 110 may determine dominance of candidate models as follows: $MP_1 \succ \{MP_4, MP_5, MP_6, MP_7, MP_{10}, MP_{11}\}$, $MP_2 \succ \{MP_7, MP_8, MP_{10}, MP_{11}, MP_{12}\}$, $MP_3 \succ \{MP_9, MP_{12}\}$, $MP_5 \succ MP_{10}$, $MP_6 \succ \{MP_{10}, MP_7 \succ MP_{11}, MP_{12}\}$ and $MP_8 \succ \{MP_{11}, MP_{12}\}$. In such an example, the model calibration engine 110 may classify a first tier of non-dominated fronts for the merged population 260 as $\{M_1, M_2, M_3\}$ (determined as a the Pareto-optimal front of the merged population 260), a second tier of non-dominated fronts for the merged population 260 as $\{M_4, M_5, M_6, M_7, M_8, M_8\}$ (determined as the Pareto-optimal front of the merged population with 260 with the first tier removed), and a third tier of non-dominated fronts for the merged population 260 as $\{M_{10}, M_{11}, M_{12}\}$ (determined as the Pareto-optimal front of the merged population 260 with the first and second tiers removed).

After tier classification, the model calibration engine 110 may determine a subset of the merged population based on the classified tiers of non-dominated fronts. Subset determination may be performed by the model calibration engine 110 to limit the size of populations in across generations of a genetic algorithm. For instance, merging of parent and child populations may result in increasingly large populations to evolve and evaluate. Successive population generations of candidate models may grow larger and larger, affecting run-time and limiting performance efficiencies of lithography model calibrations. As such, the model calibration engine 110 may reduce the size of the merged population 260 to a threshold population size (e.g., a maximum population size of one thousand (1,000) candidate models). For a merged population 260 that is lesser in size than the threshold population size, the model calibration engine 110 may simply determine the subset as the entire merged population itself (e.g., subset=merged population). For a merged population that is greater in size than the threshold population size, the model calibration engine 110 may determine a subset less than the full size of the merged population 260, and such that the determined subset includes a number of candidate models equal to (or less than) the threshold population size.

To determine a subset of the merged population based on the classified tiers of non-dominated fronts, the model calibration engine 110 may sequentially add candidate models into the subset on a tier-by-tier basis until the threshold number of candidate models has been added to the subset. In such examples, the model calibration engine 110 may determine to include candidate models in the subset based on the classified tiers, with priority given to higher tier non-dominated candidate models in the merged population 260. To effectuate such a priority, the model calibration engine 110 may first add candidate models in a first tier of non-dominated fronts (e.g., candidate models that form the Pareto-optimal front of the merged population 260), followed by candidate models in the second tier of non-dominated fronts (that form the Pareto-optimal front with the first tier removed), followed by candidate models in a third tier, and so on until the subset of the merged population reaches a maximum population size.

For a given tier of non-dominated fronts in which adding all of the candidate models in the given tier would cause the subset to exceed the threshold population size, the model calibration engine 110 may select some, but not all, of the candidate models in the given tier to add to the subset of the merged population. To differentiate between candidate models in this given tier, the model calibration engine 110 may selected candidate models based on population diversity, which the model calibration engine 110 may measure by crowding distance to neighboring candidate models in the given tier. A crowding distance may refer to a distance value (e.g., between objective function values) that the model calibration engine 110 may compute with reference to a prior neighboring candidate model and a successive neighboring candidate model in the given tier. Sequences of neighboring candidates in a given tier may be determined by the model calibration engine 110 according to ascending or descending value of a given objective function for one of the multiple objectives 220 used to calibrate the input lithography model form 210. Thus, the model calibration engine 110 may sequence candidate models a given tier of non-dominated fronts in increasing order of evaluated values for a primary object or a particular secondary objective (e.g., in increasing order of maximal error for candidate models in the given tier).

For a given candidate model, the model calibration engine 110 may compute the crowding distance as a sum of the distances (e.g., Euclidean distance) to the prior and subsequent candidate models in the tier sequence. For endpoints in the tier sequence, the model calibration engine 110 may determine a crowding distance value of infinity, as the distance to a prior candidate model for the initial candidate model and the distance to a subsequent candidate model for the final candidate model do not exist. For a given tier that would cause a merged population subset to exceed a threshold population size, the model calibration engine 110 may select the candidate models in the tier with the highest computed crowding distance values. By doing so, the model calibration engine 110 may select candidate models in sparser sections of the search space (e.g., at a greater distance from other candidate models in a given tier), which may then increase the diversity of the population evolution and result in exploration of lesser-occupied portions of the search space.

As an illustrative example presented through FIG. 2, the model calibration engine 110 may determine a merged population subset 270 of the merged population 260 with an example threshold population size of six (6) candidate models. In successively adding candidate models to the merged population subset 270, the model calibration engine 110 may first add candidate models $MP_1$, $MP_2$, and $MP_3$ of the first tier of non-dominated fronts to the merged population subset 270 (thus ensuring that the Pareto-optimal front of a given genetic iteration is included in the subset). Next, the model calibration engine 110 may determine that adding all six (6) of the candidate models of the second tier of non-dominated fronts to the merged population subset 270 would cause the merged population subset 270 to exceed the threshold population size of six (6) in this particular example. Responsive to such a determination, the model calibration engine 110 may select three (3) out of the six (6) candidate models in the second tier to add to the merged population subset 270 to reach the threshold population size, doing so based on computed crowding distance values for the candidate models $MP_4$, $MP_5$, $MP_6$, $MP_7$, $MP_8$, and $MP_9$ in the second tier.

In the example shown in FIG. 2, the model calibration engine 110 selects the candidate models $MP_4$, $MP_9$, and $MP_8$ from among the second tier of non-dominated fronts to add to the merged population subset 270, doing so based on computed crowding distances. The model calibration engine 110 may determine crowding distance values of "infinity" for candidate models $MP_4$ and $MP_9$ as endpoints of the second tier. The model calibration engine 110 may further determine that candidate model $MP_8$ has a highest crowding distance value (computed as a sum of Euclidean distances of objective function values from $MP_8$ to $MP_7$ (prior candidate model in tier sequence) and $MP_8$ to $MP_9$ (subsequent candidate model in tier sequence)) among the candidate models $MP_5$, $MP_6$, $MP_7$, and $MP_8$ with non-infinite crowding distance values. Accordingly, the model calibration engine 110 may determine a subset of a merged population based on classified tiers of non-dominated fronts, computed crowding distance values within a given tier, or a combination of both.

The above described generating of child candidate models, merging of parent and child candidate models, classifying of candidate models of the merged population into tiers, and determining of a subset of the merged population may represent a given iteration of the genetic algorithm. The model calibration engine 110 may perform multiple iterations of the genetic algorithm until a stopping criterion is satisfied. A stopping criterion (or any number of stopping criteria) may be specified as configurable calibration parameters applied by the model calibration engine 110. An example of stopping criterion is reaching a number of iterations or child population generations (e.g., perform three hundred (300) iterations of the genetic algorithm). Another example of stopping criterion is the population reaching convergence measured by overall genome diversity.

When the stopping criterion is not satisfied for a given iteration, the model calibration engine 110 may perform a subsequent iteration, and the subset of the merged population determined for a given iteration (e.g., the merged population subset 270) is used by the model calibration engine 110 as the parent model population for a subsequent iteration. When the stopping criterion is satisfied for a given iteration, the model calibration engine 110 may provide the merged population subset 270 (or a selected portion thereof) as the output of the genetic algorithm and model calibration, e.g., as the candidate lithography model set 230. In particular implementations, responsive to a determination that the stopping criterion is satisfied, the model calibration engine 110 may output the Pareto-optimal front of the merged population subset 270 as the candidate lithography model set 230.

Accordingly, the model calibration engine 110 may perform a multi-objective calibration for an input lithography model form and generate an output set of candidate lithography models from which to select as a calibrated lithography model.

Figure 3:
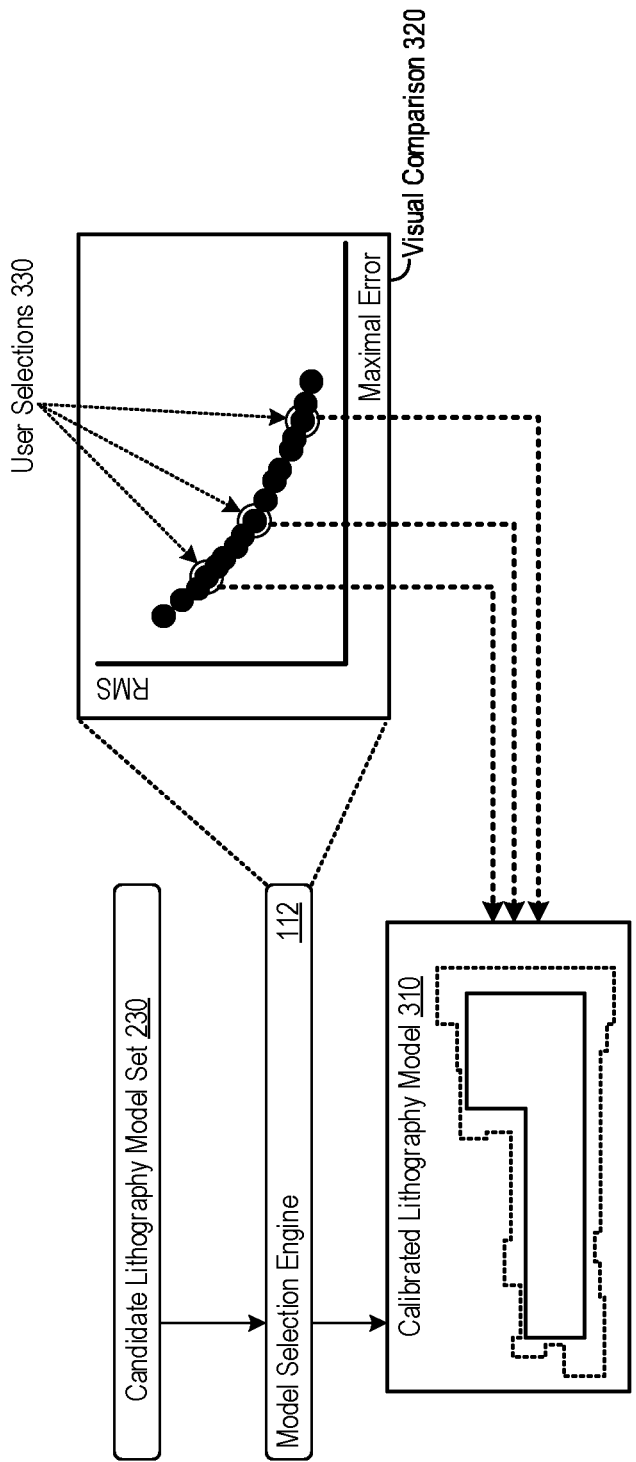
FIG. 3 shows an example model selection for a calibrated lithography model from a candidate lithography model set determined according to multiple objectives.

FIG. 3 shows an example model selection for a calibrated lithography model from a candidate lithography model set determined according to multiple objectives. In the example shown in FIG. 3, performing of the model selection is described with respect to the model selection engine 112, though various other implementations are possible.

The model selection engine 112 may provide capabilities to evaluate and select the candidate models generated for a model calibration of an input lithography model. In the particular example shown in FIG. 3, the model selection engine 112 accesses the candidate lithography model set 230, which the model calibration engine 110 may generate as described herein. As the candidate lithography model set 230 may represent a set of various candidate models determined for a multi-objective lithography model calibration, the model selection engine 112 may provide support for selection of one (or more) of the candidate models to set (e.g., save) as a calibrated lithography model. In that regard, the model selection engine 112 may support selection of a specific set of model parameter values, represented through one of the candidate models in the candidate lithography model set 230, for which to calibrate an input lithography model form.

In some examples, the model selection engine 112 may provide visual comparisons of the candidate models in the candidate lithography model set 230 to visually compare the multiple objectives 220 used in a model calibration. An example of a visual comparison is shown in FIG. 3 as the visual comparison 320, which may take the form of a graph plotting the correlation of candidate models with respect to two different objectives, a maximal error objective plotted on the X-axis of the visual comparison 320 and a RMS-based objective plotted on the Y-axis of the visual comparison 320. Also, shown in the visual comparison 320 are circular dots, each of which may represent an objective evaluation for a respective candidate model in the candidate lithography model set 230. As the candidate lithography model set 230 may include a Pareto-optimal front output from the model calibration (and underlying genetic algorithm), the plotted candidate models may provide a visual representation of possible trade-offs for model calibrations accounting for maximal error and RMS objectives (in this specific example).

By plotting a visual comparison, the model selection engine 112 may support user interaction and selection to determine a calibrated lithography model. In some examples, the model selection engine 112 may determine a given candidate lithography model among the candidate lithography model set 230 to set as a calibrated lithography model for the input lithography model form 210 based on user input received for the visual comparison 320. In FIG. 3, the model selection engine 112 may identify user selections 330 to select one or multiple candidate models plotted in the visual comparison, and set one (or more) of the user selections 330 as a calibrated lithography model 310.

In some implementations, the model selection engine 112 may generate visual comparisons for multi-objectives on a pair-wise basis. For multi-objective calibrations with three or more objectives, the model selection engine 112 may plot only two objectives on a given visual comparison, which may support user evaluation of trade-offs and candidate model selection(s) with greater ease. For a selected set of candidate models for a first visual comparison (e.g., selecting ten candidate models for the visual comparison 320 for maximal error and RMS evaluation), the model selection engine 112 may plot a second visual comparison with the selected candidate models and a next objective of the multiple objectives (e.g., a second visual comparison plotted consistency (a third objective) and either maximal error or RMS evaluation). The model selection engine 112 may continue to plot pair-wise objective visual comparisons until each of the multiple objectives used in a model calibration is plotted and evaluated. In some implementations, each of the pair-wise visual comparisons are plotted by the model selection engine 112 to evaluate a primary objective and each respective secondary objective in the multi-objective calibration.

In other implementations, the model selection engine 112 may use a clustering method to cluster the candidate lithography model set 230 into one or a few model groups according to the distance of objective function values between different models, and determine a centroid model from each individual cluster. The model selection engine 112 may set the centroid model(s) as a calibrated lithography model 310.

The model selection engine 112 may thus support review of candidate models that form a determined Pareto-optimal front for a model calibration, allowing selection of one or multiple candidate models from an output solution of a multi-objective optimization problem assessed by genetic algorithms described herein. In some examples, the model selection engine 112 may apply a subsequent local search on the user-selected candidate models in the candidate lithography model set 230 or provide a capability to skip a local search application on the selected candidate models (which may improve calibration latency).

As described herein, multi-objective calibrations may be supported by a model calibration engine 110 and model selection engine 112. The described multi-objective calibration features may provide capabilities for calibration of a lithography model according to multiple objectives, e.g., specified as a primary objective and one or more multiple secondary objectives. Genetic algorithms applied during model calibration may specifically account for the multiple objectives, and populations of candidate models may be configured by the model calibration engine 110 to evolve specifically to explore Pareto-optimal fronts and sparse search spaces. Doing so may increase output accuracy (ideally determined candidate lithography model sets are a subset of the true Pareto front of the multi-optimization problem), evolution diversity (candidate models in determined candidate lithography model sets are uniformly distributed and diverse), and coverage (determined candidate lithography model sets cover the spectrum of the true Pareto front, including extrema).

Figure 4:
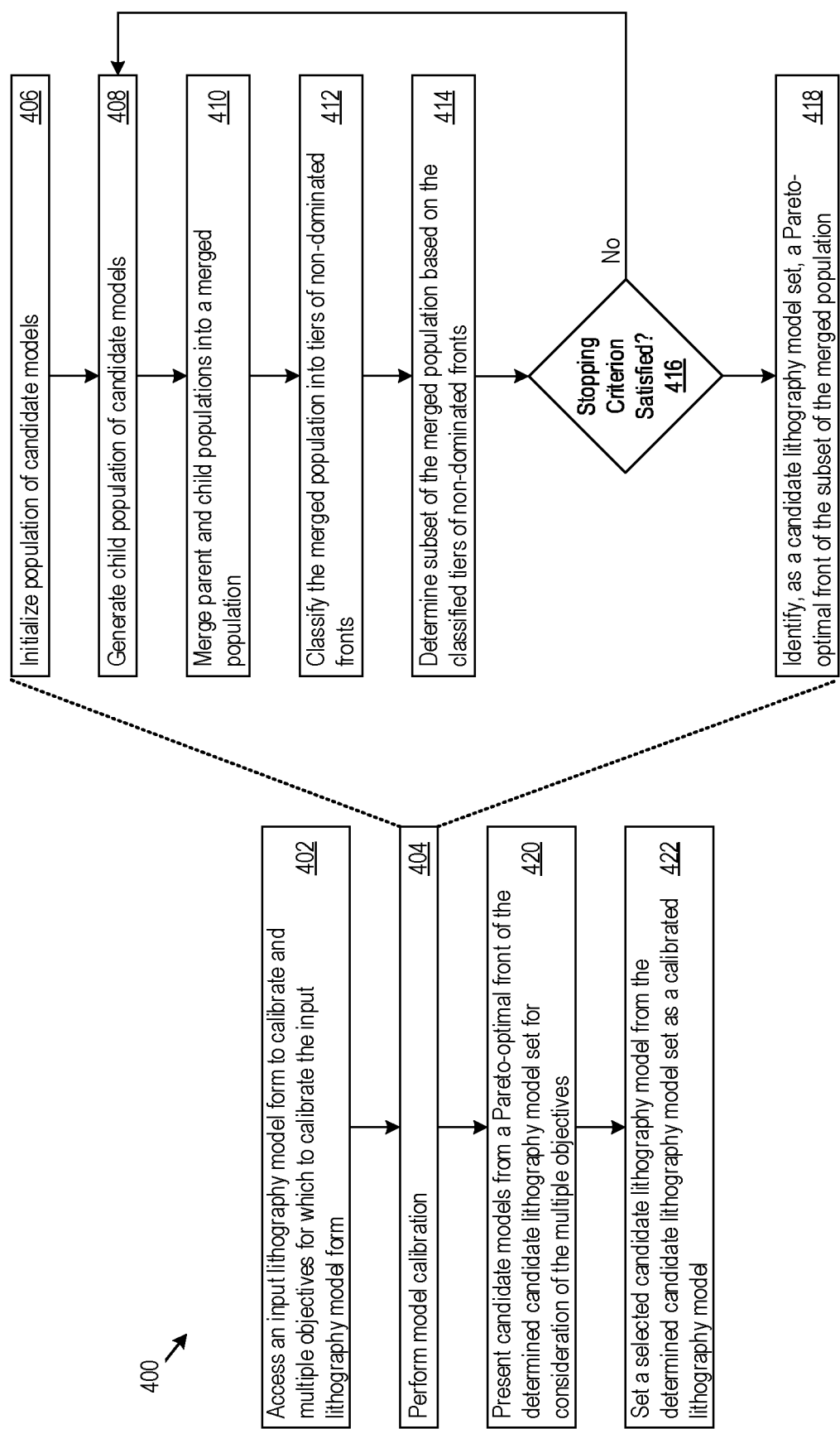
FIG. 4 shows an example of logic that a system may implement to support multi-objective calibrations of lithography models.

FIG. 4 shows an example of logic 400 that a system may implement to support multi-objective calibrations of lithography models. In some examples, the computing system 100 may implement the logic 400 as hardware, executable instructions stored on a machine-readable medium, or as a combination of both. The computing system 100 may implement the logic 400 via the model calibration engine 110 and the model selection engine 112, for example, through which the computing system 100 may perform or execute the logic 400 as a method to support multi-objective calibrations of lithography models. However, other implementation options are possible.

In implementing the logic 400, the model calibration engine 110 may access an input lithography model form to calibrate and multiple objectives for which to calibrate the input lithography model form (402). As such, the model calibration engine 110 may calibrate a lithography model as represented through the input lithography model form. The multiple objectives may include two (or more) objectives, each evaluated via respective objective function. The model calibration engine 110 may also access physical measurement data (e.g., a gauge set) to evaluate candidate model outputs against as well as any number of calibration parameters (e.g., Gaussian mutation probabilities, initial population sizes, max population sizes, number of iterations or population generations, etc.).

In implementing the logic 400, the model calibration engine 110 may also perform a model calibration (404) for the input lithography model. The model calibration engine 110 may do so via application of a tuned genetic algorithm, which may include initializing a population of candidate models (406) and generating a child population of candidate models (408). Child population generation by the model calibration engine 110 may be performed through binary tournament selection based on the classified tiers of non-dominated fronts and/or crowding distance values, crossovers (with resist term crossovers prohibited), and mutations. Then, as described herein, the model calibration engine 110 may merge a child population with a parent population (used to generated the child population) into a merged population (410) and classify the merged population into tiers of non-dominated fronts (412).

To control population sizes, the model calibration engine 110 may determine whether a merged population exceeds a threshold population size (e.g., specified as a calibration parameter). If so, the model calibration engine 110 may determine a subset of the merged population based on the classified tiers of non-dominated fronts (414). Subset determination may include computation of crowding distances and selection of specific candidate models to add to the subset in a given tier based on the computed crowding distances, as described herein. If the merged population does not exceed the population size threshold, the model calibration engine 110 may determine the subset of the merged population simply as the entire merged population itself (e.g. in this case, the subset is referred to or determined as the full set).

In performing the model calibration, the model calibration engine 110 may determine whether a stopping criterion is satisfied (416), which may include whether a threshold number of iterations of the genetic algorithm is performed, whether the population is converged, or any other configurable criteria. If the stopping criterion is not satisfied, the model calibration engine may perform another algorithm iteration (which may include steps 408, 410, 412, 414, and 416), using the subset of the merged population determined for a given iteration as the parent population for the subsequent iteration. Responsive to a determination that the stopping criterion is satisfied, the model calibration engine 110 may identify, as a candidate lithography model set (e.g., the output of the model calibration), a Pareto-optimal front of the subset of the merged population (418).

In implementing the logic 400, the model selection engine 112 may present candidate models from the Pareto-optimal front of the determined candidate lithography model set for consideration of the multiple objectives (420). Such presentation may include interactive pair-wise correlations between objectives of the model calibration for user-evaluation. The model selection engine 112 may set a selected candidate lithography model from the determined candidate lithography model set as a calibrated lithography model (422) as well.

While example features are shown and described through FIG. 4, the logic 400 may include any number of additional or alternative steps as well. The logic 400 may additionally or alternatively implement any other multi-objective calibration features described herein, for example any number of features with respect to the model calibration engine 110, model selection engine 112, or combinations of both.

Figure 5:
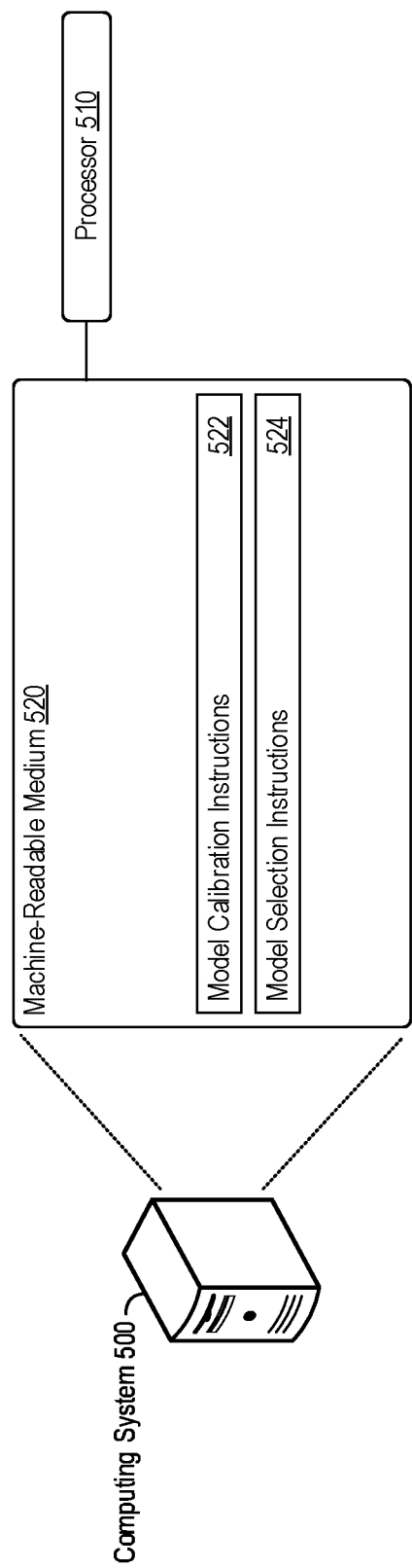
FIG. 5 shows an example of a computing system that supports multi-objective calibrations of lithography models.

FIG. 5 shows an example of a computing system 500 that supports multi-objective calibrations of lithography models. The computing system 500 may include a processor 510, which may take the form of a single processor or multiple processors. The processor(s) 510 may include a central processing unit (CPU), microprocessor, or any hardware device suitable for executing instructions stored on a machine-readable medium. The computing system 500 may include a machine-readable medium 520. The machine-readable medium 520 may take the form of any non-transitory electronic, magnetic, optical, or other physical storage device that stores executable instructions, such as the model calibration instructions 522 and model selection instructions 524 shown in FIG. 5. As such, the machine-readable medium 520 may be, for example, random access memory (RAM) such as a dynamic RAM (DRAM), flash memory, spin-transfer torque memory, an electrically-erasable programmable read-only memory (EEPROM), a storage drive, an optical disk, and the like.

The computing system 500 may execute instructions stored on the machine-readable medium 520 through the processor 510. Executing the instructions may cause the computing system 500 to perform any of the multi-objective calibration features described herein, including according to any of the features of the model calibration engine 110, the model selection engine 112, or combinations of both.

For example, execution of the model calibration instructions 522 by the processor 510 may cause the computing system 500 to determine a candidate lithography model set from which to calibrate a lithography model according to multiple objectives, wherein the lithography model may be configured to simulate a lithographic process for manufacturing an integrated circuit and each of the multiple objectives may be evaluated for the lithography model through a respective objective function. Determination of the candidate lithography model set by the computing system through execution of the model calibration instructions 522 may include initializing a population of parent candidate models, the parent candidate models derived based on the lithography model and each given parent candidate model having a respective model parameter value set for the lithography model; generating child candidate models from the parent candidate models, merging the parent candidate models and the child candidate models into a merged population of candidate models, classifying the candidate models of the merged population into tiers of non-dominated fronts according to the respective objective functions for the multiple objectives, determining a subset of the merged population based on the classified tiers of non-dominated fronts, and identifying, as the candidate lithography model set, the Pareto-optimal front of the subset of the merged population determined based on the classified tiers. Execution of the model selection instructions 524 may cause the computing system 500 to set one or multiple given candidate lithography models in the candidate lithography model set as calibrated lithography models for simulating the lithographic process.

Any additional or alternative multi-objective calibration features as described herein may be implemented via the model calibration instructions 522, model selection instructions 524, or a combination of both.

The systems, methods, devices, and logic described above, including the model calibration engine 110 and the model selection engine 112, may be implemented in many different ways in many different combinations of hardware, logic, circuitry, and executable instructions stored on a machine-readable medium. For example, the model calibration engine 110, model selection engine 112, or both, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine readable instructions stored on the medium, which when executed in an endpoint, computer system, or other device, cause the device to perform operations according to any of the description above, including according to any features of the model calibration engine 110, the model selection engine 112, or combinations of both.

The processing capability of the systems, devices, and engines described herein, including the model calibration engine 110 and the model selection engine 112, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:
by a computing system:
    determining a candidate lithography model set from which to calibrate a lithography model according to multiple objectives, wherein the lithography model is configured to simulate a lithographic process for manufacturing an integrated circuit, wherein each of the multiple objectives is evaluated for the lithography model through a respective objective function, and wherein determining comprises:
        initializing a population of parent candidate models, the parent candidate models derived based on the lithography model and each given parent candidate model having a respective model parameter value set for the lithography model;
        generating child candidate models from the parent candidate models;
        merging the parent candidate models and the child candidate models into a merged population of candidate models;
        classifying the candidate models of the merged population into tiers of non-dominated fronts according to the respective objective functions for the multiple objectives;
        determining a subset of the merged population based on the classified tiers of non-dominated fronts; and
        identifying, as the candidate lithography model set, a Pareto-optimal front of the subset of the merged population determined based on the classified tiers; and
    setting a given candidate lithography model in the candidate lithography model set as a calibrated lithography model for simulating the lithographic process.

2. The method of claim 1, comprising performing multiple iterations of generating the child candidate models, merging the parent and child candidate models, classifying the candidate models of the merged population, and determining the subset of the merged population until a stopping criterion is satisfied,
wherein the subset of the merged population determined for a given iteration is used as the parent model population for a subsequent iteration.

3. The method of claim 1, determining the subset of the merged population comprises sequentially adding candidate models into the subset on a tier by tier basis until a threshold number of candidate models has been added to the subset.

4. The method of claim 3, wherein determining the subset of the merged population further comprises selecting some, but not all, of the candidate models of a given tier of non-dominated fronts to add to the subset based on a computed distance between the candidate models and neighboring candidate models of the given tier.

5. The method of claim 1, wherein the multiple objectives comprise a primary objective evaluated through a root mean square-based objective function and a secondary objective evaluated through a maximal critical dimension error-based objective function.

6. The method of claim 1, wherein the multiple objectives comprise a primary objective evaluated for a full set of gauges of physical measurement data used to evaluate the lithography model a secondary objective evaluated for a selected subset of the gauges.

7. The method of claim 1, further comprising:
providing a visual comparison of candidate lithography models in the candidate lithography model set evaluated for the multiple objectives; and
determining the given candidate lithography model to set as the calibrated lithography model based on user input received for the visual comparison.

8. A system comprising:
a model calibration engine configured to determine a candidate lithography model set from which to calibrate a lithography model according to multiple objectives, wherein the lithography model is configured to simulate a lithographic process for manufacturing an integrated circuit, wherein each of the multiple objectives is evaluated for the lithography model through a respective objective function, and wherein the model calibration engine is configured to determine the candidate lithography model set by:
    initializing a population of parent candidate models, the parent candidate models derived based on the lithography model and each given parent candidate model having a respective model parameter value set for the lithography model;

generating child candidate models from the parent candidate models;
merging the parent candidate models and the child candidate models into a merged population of candidate models;
classifying the candidate models of the merged population into tiers of non-dominated fronts according to the respective objective functions for the multiple objectives;
determining a subset of the merged population based on the classified tiers of non-dominated fronts; and
identifying, as the candidate lithography model set, a Pareto-optimal front of the subset of the merged population determined based on the classified tiers; and
a model selection engine configured to set a given candidate lithography model in the candidate lithography model set as a calibrated lithography model for simulating the lithographic process.

9. The system of claim 8, wherein the model calibration engine is configured to perform multiple iterations of generating the child candidate models, merging the parent and child candidate models, classifying the candidate models of the merged population, and determining the subset of the merged population until a stopping criterion is satisfied,
wherein the subset of the merged population determined for a given iteration is used as the parent model population for a subsequent iteration.

10. The system of claim 8, wherein the model calibration engine is configured to determine the subset of the merged population by sequentially adding candidate models into the subset on a tier by tier basis until a threshold number of candidate models has been added to the subset.

11. The system of claim 10, wherein the model calibration engine is configured to determine the subset of the merged population further by selecting some, but not all, of the candidate models of a given tier of non-dominated fronts to add to the subset based on a computed distance between the candidate models and neighboring candidate models of the given tier.

12. The system of claim 8, wherein the multiple objectives comprise a primary objective evaluated through a root mean square-based objective function and a secondary objective evaluated through a maximal critical dimension error-based objective function.

13. The system of claim 8, wherein the multiple objectives comprise a primary objective evaluated for a full set of gauges of physical measurement data used to evaluate the lithography model a secondary objective evaluated for a selected subset of the gauges.

14. The system of claim 8, wherein the model selection engine is further configured to:
cluster the candidate lithography models in the candidate lithography model set based on model similarity; and
determine the given candidate lithography model to set as the calibrated lithography model based on the clustering.

15. A non-transitory machine-readable medium comprising instructions that, when executed by a processor, cause a computing system to:
determine a candidate lithography model set from which to calibrate a lithography model according to multiple objectives, wherein the lithography model is configured to simulate a lithographic process for manufacturing an integrated circuit, wherein each of the multiple objectives is evaluated for the lithography model through a respective objective function, and wherein determination of the candidate lithography model set comprises:
initializing a population of parent candidate models, the parent candidate models derived based on the lithography model and each given parent candidate model having a respective model parameter value set for the lithography model;
generating child candidate models from the parent candidate models;
merging the parent candidate models and the child candidate models into a merged population of candidate models;
classifying the candidate models of the merged population into tiers of non-dominated fronts according to the respective objective functions for the multiple objectives;
determining a subset of the merged population based on the classified tiers of non-dominated fronts; and
identifying, as the candidate lithography model set, a Pareto-optimal front of the subset of the merged population determined based on the classified tiers; and
set a given candidate lithography model in the candidate lithography model set as a calibrated lithography model for simulating the lithographic process.

16. The non-transitory machine-readable medium of claim 15, wherein the instructions further cause the computing system to perform multiple iterations of generating the child candidate models, merging the parent and child candidate models, classifying the candidate models of the merged population, and determining the subset of the merged population until a stopping criterion is satisfied,
wherein the subset of the merged population determined for a given iteration is used as the parent model population for a subsequent iteration.

17. The non-transitory machine-readable medium of claim 15, wherein the instructions cause the computing system to determine the subset of the merged population by sequentially adding candidate models into the subset on a tier by tier basis until a threshold number of candidate models has been added to the subset.

18. The non-transitory machine-readable medium of claim 17, wherein the instructions cause the computing system to determine the subset of the merged population further by selecting some, but not all, of the candidate models of a given tier of non-dominated fronts to add to the subset based on a computed distance between the candidate models and neighboring candidate models of the given tier.

19. The non-transitory machine-readable medium of claim 15, the multiple objectives comprise:
a primary objective evaluated through a root mean square-based objective function and a secondary objective evaluated through a maximal critical dimension error-based objective function; or
a primary objective evaluated for a full set of gauges of physical measurement data used to evaluate the lithography model a secondary objective evaluated for a selected subset of the gauges.

20. The non-transitory machine-readable medium of claim 15, wherein the instructions further cause the computing system to:
provide a visual comparison of candidate lithography models in the candidate lithography model set evaluated for the multiple objectives;
cluster the candidate lithography models in the candidate lithography model set based on model similarity; and determine the given candidate lithography model to set as the calibrated lithography model based on user input received for the visual comparison or the clustering.

* * * * *